(12) United States Patent
Feng (10) Patent No.: US 11,839,036 B2
(45) Date of Patent: Dec. 5, 2023

(54) FLEXIBLE DISPLAY DEVICE

(71) Applicant: Wuhan China Star Optoelectronics Semiconductor Display Technology Co., Ltd., Hubei (CN)

(72) Inventor: Zikang Feng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 584 days.

(21) Appl. No.: 17/048,594

(22) PCT Filed: Jun. 23, 2020

(86) PCT No.: PCT/CN2020/097629
§ 371 (c)(1),
(2) Date: Oct. 18, 2020

(87) PCT Pub. No.: WO2021/208236
PCT Pub. Date: Oct. 21, 2021

(65) Prior Publication Data
US 2023/0116984 A1     Apr. 20, 2023

(30) Foreign Application Priority Data
Apr. 16, 2020   (CN) .......................... 202010297753.9

(51) Int. Cl.
*H05K 5/02*   (2006.01)
*G06F 1/16*   (2006.01)

(52) U.S. Cl.
CPC ......... *H05K 5/0217* (2013.01); *G06F 1/1652* (2013.01)

(58) Field of Classification Search
CPC .. H05K 5/0217; H05K 5/0017; G06F 1/1652; G06F 1/1624
See application file for complete search history.

(56) References Cited

U.S. PATENT DOCUMENTS

| 11,297,723 B2* | 4/2022 | Ahn ....................... G06F 1/1652 |
| 2013/0058063 A1* | 3/2013 | O'Brien ................ G06F 1/1624 |
| | | 361/807 |
| 2018/0014417 A1 | 1/2018 | Seo et al. |
| 2020/0314225 A1* | 10/2020 | Ahn ....................... G09F 9/301 |
| 2020/0363841 A1* | 11/2020 | Kim ...................... G06F 1/1652 |
| 2021/0375165 A1* | 12/2021 | Feng ....................... G09F 9/301 |
| 2021/0383727 A1* | 12/2021 | Han ........................ G06F 1/1624 |
| 2022/0104364 A1* | 3/2022 | Yang ................... H04M 1/0268 |
| 2022/0311848 A1* | 9/2022 | Delaporte ............. G06F 1/1652 |

FOREIGN PATENT DOCUMENTS

| CN | 109062334 | 12/2018 |
| CN | 110047387 | 7/2019 |
| CN | 110491289 | 11/2019 |
| CN | 110718149 | 1/2020 |
| CN | 111510537 | 8/2020 |

* cited by examiner

*Primary Examiner* — Sagar Shrestha (57) ABSTRACT

A flexible display device is provided. The flexible display device includes a first housing, a second housing, a rolling mechanism, a flexible display screen, and a support plate mechanism. The flexible display screen can be retracted or expanded relative to the rolling mechanism. When the flexible display screen is completely expanded, a second support surface of a support plate and a first support surface of the second housing support the flexible display screen with their whole surfaces, thereby preventing the flexible display screen from collapsing and deforming.

16 Claims, 4 Drawing Sheets

FLEXIBLE DISPLAY DEVICE

RELATED APPLICATIONS

This application is a National Phase of PCT Patent Application No. PCT/CN2020/097629 having International filing date of Jun. 23, 2020, which claims the benefit of priority of Chinese Patent Application No. 202010297753.9 filed on Apr. 16, 2020. The contents of the above applications are all incorporated by reference as if fully set forth herein in their entirety.

FIELD AND BACKGROUND OF THE INVENTION

The present disclosure relates to the field of display manufacturing technologies, and more particularly, to a flexible display device.

With development of display technologies, functions and uses of display panels and display devices are also continuously improving.

With regard to flexible display devices, they have received widespread attention due to their bendability and flexibility. The flexible display devices can be flexibly bent and folded during use and are gradually applied to different occasions. However, among current flexible display devices, flexible panels have bending radius limitations, while shapes and states of the flexible display devices during bending are unable to remain stable and have problems of deformations and collapse. Meanwhile, flexible screens have a phenomenon of nonuniform stresses after bending, thereby affecting normal use of the display devices.

Therefore, it is necessary to provide a solution for the problems in current technology.

Technical problem: in summary, when current flexible display devices
are bent or folded, bending radii are limited, and shapes and states of the flexible display devices during bending are unable to remain stable and have problems of deformations and collapse, which affect use of the display devices and user experience.

SUMMARY OF THE INVENTION

To solve the above problems, the present disclosure provides a flexible display device to solve the problems of deformations and collapse of display devices caused by unstable shapes and states of flexible screens during use that affect device performances and cause poorer users' experiences.

To solve the above technical problems, an embodiment of the present disclosure provides technical solutions as follows:

In a first aspect, an embodiment of the present disclosure provides a flexible display device. The flexible display device includes:

a first housing including a first accommodating cavity defined in the first housing;

a second housing disposed slidably relative to the first housing along a first direction, wherein the second housing includes a first support structure with one end mounted into the first accommodating cavity and an operation structure connected to another end of the first support structure, and the first support structure includes a first support surface defined on a surface of the first support structure and a second accommodating cavity defined in the first support structure;

a support plate mechanism, wherein one end of the support plate mechanism is disposed rotatably in the first accommodating cavity, another end of the support plate mechanism includes a support plate mounted in the second accommodating cavity, and a second support surface is defined on a surface of the support plate;

a rolling mechanism disposed rotatably in the first accommodating cavity of the first housing; and a flexible display panel, wherein one end of the flexible display panel is connected to the rolling mechanism and rolled up in the first accommodating cavity by the rolling mechanism, and another end of the flexible display panel covers the first support surface and is connected to the operation structure;

wherein when the second housing slides relative to the first housing to expand, the flexible display panel further covers the second support surface of the support plate;

a distance between the second accommodating cavity and the first support surface increases along a direction away from the support plate, and a thickness of the operation structure is same as a thickness of the first housing.

According to an embodiment of the present disclosure, the support plate mechanism further includes first locating parts disposed at one end of the support plate, and first locating grooves are defined in the first accommodating cavity of the first housing corresponding to the first locating parts.

According to an embodiment of the present disclosure, the first locating parts are disposed on both sides of the one end of the support plate, and inner walls on both sides of the first accommodating cavity are correspondingly provided with the first locating grooves.

According to an embodiment of the present disclosure, each of the first locating parts includes an arc sliding block, and the first locating grooves are corresponding arc sliding grooves.

According to an embodiment of the present disclosure, the arc sliding block rotates around a first rotation axis, and the first rotation axis and the first support surface are on a same plane.

According to an embodiment of the present disclosure, the support plate mechanism further includes second locating parts disposed at another end of the support plate, and inner walls of the second accommodating cavity of the second housing are provided with channels of second locating grooves for the second locating parts to extend into the second accommodating cavity.

According to an embodiment of the present disclosure, the first locating parts are disposed on both sides of the one end of the support plate, inner walls on both sides of the first accommodating cavity are correspondingly provided with the first locating grooves, and both sides of the another end of the support plate are provided with the second locating parts.

According to an embodiment of the present disclosure, when the flexible display panel is completely expanded, the first support surface and the second support surface are on a same plane, and the flexible display panel covers the first support surface and the second support surface.

According to an embodiment of the present disclosure, when the flexible display panel is completely expanded, the first support surface and the second support surface are on a same plane, and the flexible display panel covers the first support surface and the second support surface.

According to an embodiment of the present disclosure, a thickness of the operation structure is same as a thickness of the first housing.

In a second aspect, an embodiment of the present disclosure provides a flexible display device. The flexible display device includes:

a first housing comprising a first accommodating cavity defined in the first housing;

a second housing disposed slidably relative to the first housing along a first direction, wherein the second housing includes a first support structure with one end mounted into the first accommodating cavity and an operation structure connected to another end of the first support structure, and the first support structure includes a first support surface defined on a surface of the first support structure and a second accommodating cavity defined in the first support structure;

a support plate mechanism, wherein one end of the support plate mechanism is disposed rotatably in the first accommodating cavity, another end of the support plate mechanism includes a support plate mounted in the second accommodating cavity, and a second support surface is defined on a surface of the support plate;

a rolling mechanism disposed rotatably in the first accommodating cavity of the first housing; and a flexible display panel, wherein one end of the flexible display panel is connected to the rolling mechanism and rolled up in the first accommodating cavity by the rolling mechanism, and another end of the flexible display panel covers the first support surface and is connected to the operation structure;

wherein when the second housing slides relative to the first housing to expand, the flexible display panel further covers the second support surface of the support plate.

According to an embodiment of the present disclosure, the support plate mechanism further includes first locating parts disposed at one end of the support plate, and first locating grooves are defined in the first accommodating cavity of the first housing corresponding to the first locating parts.

According to an embodiment of the present disclosure, the first locating parts are disposed on both sides of the one end of the support plate, and inner walls on both sides of the first accommodating cavity are correspondingly provided with the first locating grooves.

According to an embodiment of the present disclosure, each of the first locating parts includes an arc sliding block, and the first locating grooves are corresponding arc sliding grooves.

According to an embodiment of the present disclosure, the arc sliding block rotates around a first rotation axis, and the first rotation axis and the first support surface are on a same plane.

According to an embodiment of the present disclosure, the support plate mechanism further includes second locating parts disposed at another end of the support plate, and inner walls of the second accommodating cavity of the second housing are provided with channels of second locating grooves for the second locating parts to extend into the second accommodating cavity.

According to an embodiment of the present disclosure, the first locating parts are disposed on both sides of the one end of the support plate, inner walls on both sides of the first accommodating cavity are correspondingly provided with the first locating grooves, and both sides of the another end of the support plate are provided with the second locating parts.

According to an embodiment of the present disclosure, a distance between the second accommodating cavity and the first support surface increases along a direction away from the support plate.

According to an embodiment of the present disclosure, the second accommodating cavity includes a curved portion disposed adjacent to the first support surface.

According to an embodiment of the present disclosure, when the flexible display panel is completely expanded, the first support surface and the second support surface are on a same plane, and the flexible display panel covers the first support surface and the second support surface.

According to an embodiment of the present disclosure, the first support surface and the second support surface support with their whole surfaces.

According to an embodiment of the present disclosure, a thickness of the operation structure is same as a thickness of the first housing.

According to an embodiment of the present disclosure, when the flexible display panel is completely expanded, the first support surface and the second support surface are on a same plane, and the flexible display panel covers the first support surface and the second support surface.

According to an embodiment of the present disclosure, a thickness of the operation structure is same as a thickness of the first housing.

Beneficial effect: in summary, the beneficial effect of the embodiments of the present disclosure is:

The present disclosure provides a flexible display device with a first housing and a second housing and meanwhile disposes a rolling mechanism and a support plate mechanism in the first housing. One end of a flexible display panel is rolled up on the rolling mechanism, and another end of the flexible display panel is connected to the second housing. The first housing is slidable relative to the second housing. When the second housing slides, an operation structure expands the flexible display panel, thereby expanding a size of a display screen of the flexible display device, and when the second housing completely slides, that is, the flexible display screen is completely expanded, a first support surface of a first support structure and a second support surface of a support plate can effectively support the flexible display panel, thereby ensuring the flexible display screen in the flexible display device of an embodiment of the present disclosure to be completely fixed, preventing the flexible screen from collapsing and deforming easily during operation, and improving display effect and performances of the flexible display device.

DESCRIPTION OF SPECIFIC EMBODIMENTS OF THE INVENTION

The specific embodiments described with reference to the attached drawings are all exemplary and are intended to illustrate and interpret the present disclosure.

Figure 1A:
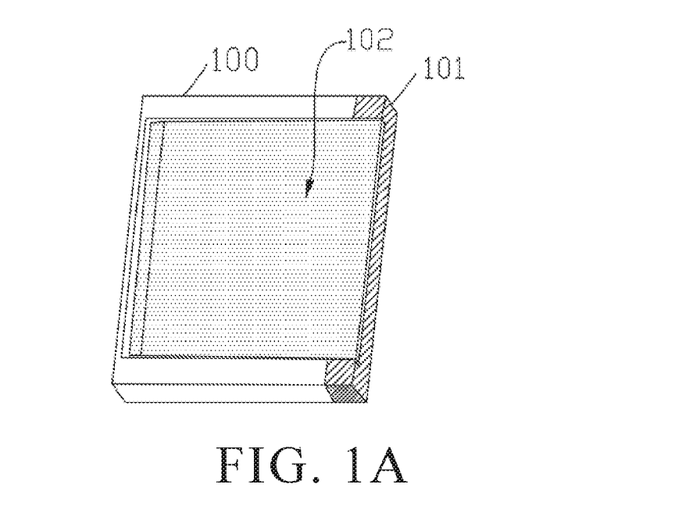
FIG. 1A is a schematic structural diagram of a flexible display device
according to an embodiment of the present disclosure.

An embodiment of the present disclosure provides a flexible display device. In the embodiment of the present disclosure, as shown in FIG. 1A, FIG. 1A is a schematic structural diagram of the flexible display device according to the embodiment of the present disclosure. The flexible display device includes a first housing 100, a second housing 101, and a flexible display screen 102. The flexible display screen 102 is a flexible display panel in the embodiment of the present disclosure. FIG. 1A is the flexible display device of this embodiment of the present disclosure in a closed state, that is, a schematic structural diagram of the flexible display screen 102 in a completely retracted state. In this state, a volume of the flexible display device is smallest, which is more convenient to carry and use. Specifically, the first housing 100 and the second housing 101 are disposed opposite to each other, and the first housing 100 and the second housing 101 are relatively slidable along one end of the first housing 100 to increase or reduce an area of the display panel. Specifically, the end of the first housing 100 has an opening 103, the second housing 101 is mounted into the first housing 100 through the opening 103, and meanwhile, one end of the flexible display screen 102 is connected to the second housing 101.

Figure 1B:
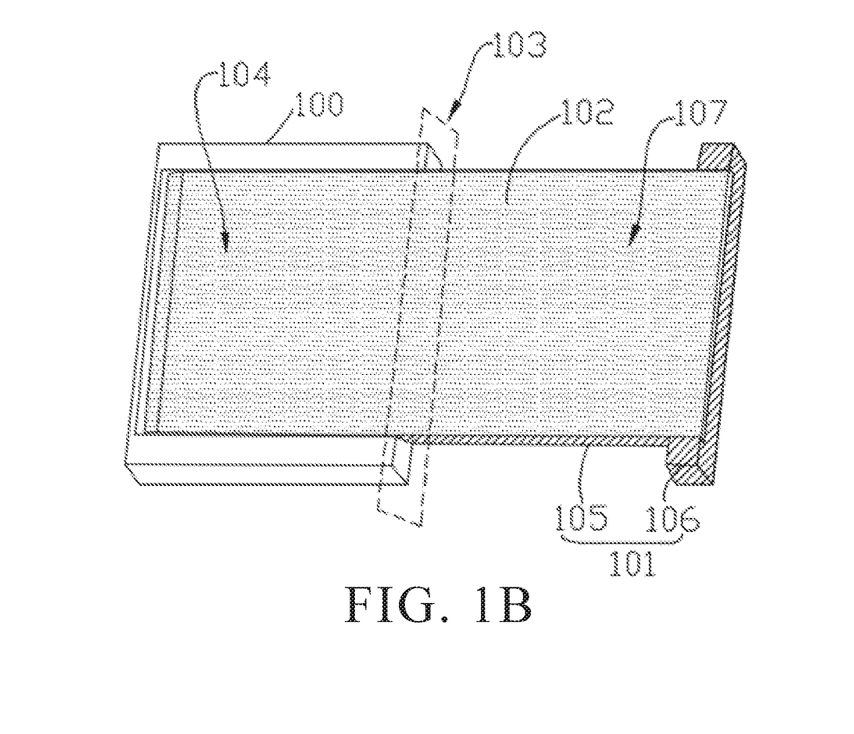
FIG. 1B is a schematic structural diagram of a flexible display device according to another embodiment of the present disclosure.

As shown in FIG. 1B, FIG. 1B is a schematic structural diagram of a flexible display device according to another embodiment of the present disclosure. At this stage, FIG. 1B is a schematic structural diagram of the flexible display device of this embodiment of the present disclosure when extended, that is, a situation when the flexible display screen 102 is expanded. Combining with a structure of the flexible display device in FIG. 1A, the first housing 100 includes a first accommodating cavity 104, and the second housing 101 is drawn out from the first accommodating cavity 104 of the first housing 100 along the opening 103 of the end of the first housing 100.

Specifically, the second housing 101 includes a first support structure 105 with one end mounted into the first accommodating cavity 104 and an operation structure 106 connected to another end of the first support structure 105, and the flexible display screen 102 is connected to the operation structure 106 and expanded or retracted with movement of the operation structure 106. Wherein, the first support structure 105 also includes a first support surface 107 and a corresponding second accommodating cavity defined under the first support surface 107, and the first support surface 107 supports the flexible display screen 102 covering thereon.

A completely expanded state is shown in FIG. 1B. After completely expanded, the area of the flexible display screen 102 becomes larger, a display area of the screen becomes larger with it, and meanwhile, the first support surface 107 completely supports the flexible display screen 102 in its corresponding area.

Figure 2:
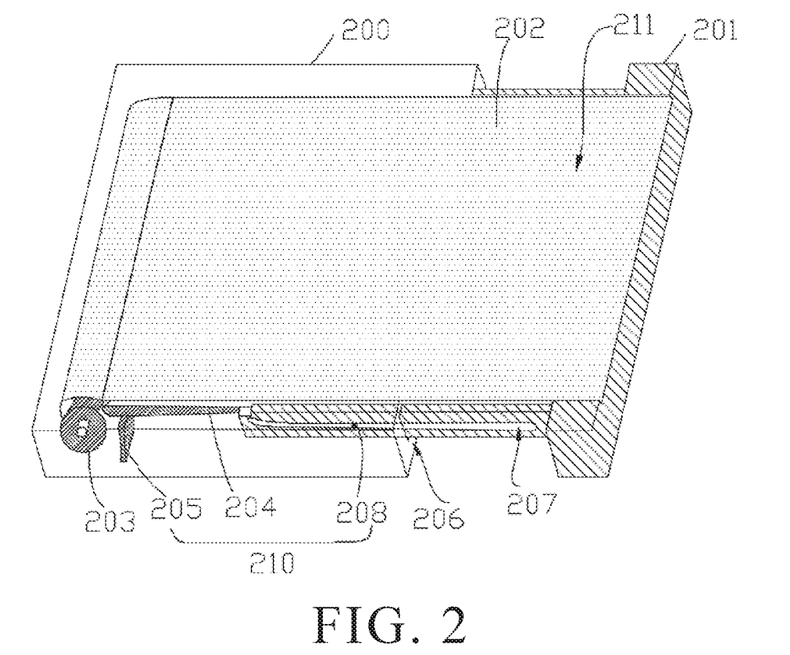
FIG. 2 is another schematic cross-sectional structural diagram of a flexible display device according to an embodiment of the present disclosure.

Specifically, as shown in FIG. 2, FIG. 2 is another schematic cross-sectional structural diagram of a flexible display device according to an embodiment of the present disclosure. The flexible display device includes a first housing 200, a second housing 201, and a flexible display screen 202.

Further, in this embodiment of the present disclosure, two opposite sides of the first housing 200 further dispose sliding rails 206, sides of the second housing 201 can be mounted onto the sliding rails 206, and along a direction of the sliding rails 206, that is, a first direction, the second housing 201 slides relative to the first housing 200, thereby achieving retracting and expanding functions of the flexible display screen.

Meanwhile, a height of two sides of the second housing 201 corresponding to the sliding rails 206 on the two sides of the first housing 200 is not greater than a height of the sliding rails 206 to prevent the second housing 201 from being uneasy to slide when sliding. Further, the two sides of the second housing 201 corresponding to the sliding rails 206 are further provided with second locating grooves 207.

The flexible display device also includes a rolling mechanism 203 disposed in the first housing 200 and accommodated in the first accommodating cavity, and meanwhile, the rolling mechanism 203 is fixed in the first housing 200 and is rotatable. In this embodiment of the present disclosure, one end of the flexible display screen 202 is connected to the second housing 201, and another end of the flexible display screen 202 is connected to the rolling mechanism 203 and is rolled up in the first accommodating cavity by the rolling mechanism 203. When the second housing 201 is extended, the flexible display screen 202 is driven, and meanwhile, pulled by the flexible display screen 202, the rolling mechanism 203 rotates accordingly, thereby enlarging or reducing an area of the display area of the flexible display screen 202.

Further, an embodiment of the present disclosure further includes a support plate mechanism 210. One end of the support plate mechanism 210 is disposed rotatably in the first accommodating cavity of the first housing 200, another end of the support plate mechanism 210 is mounted in the second accommodating cavity of the first support structure, and specifically, the support plate mechanism 210 includes a support plate 204. The support plate 204 is disposed in the first housing 200, and meanwhile, two ends of the support plate 204 are respectively connected to the first housing 200 and the second housing 201.

An upper surface of the support plate 204 in this embodiment of the present disclosure may be a flat surface, such as a horizontal support surface, and this flat surface may be a support surface of the flexible display screen. An area of the horizontal support surface is not less than an area of the corresponding flexible display panel supported by the horizontal support surface. The support plate mechanism 210 further includes first locating parts 205 and second locating parts 208 disposed on both sides of the support plate 204, the first locating parts 205 are disposed at one end of the support plate 204 adjacent to the rolling mechanism 203, and the second locating parts 208 are disposed at another end of the support plate 204 away from the rolling mechanism 203.

First locating grooves matching with the first locating parts 205 are disposed at corresponding positions of the first housing 200, and the first locating grooves may be arc slideways. Second locating grooves matching with the second locating parts 208 are disposed at corresponding positions of the second housing 201. To realize connecting and sliding functions of the first locating parts 205 and the second locating parts 208, in the embodiment of the present disclosure, when the first locating parts 205 are arc sliding blocks, the corresponding first locating grooves are arc sliding grooves, thereby matching the arc sliding grooves with the arc sliding blocks. Meanwhile, inner walls on both sides of the second accommodating cavity of the second housing 201 are provided with channels of the second locating grooves 207 for the second locating parts 208 to extend into the second accommodating cavity, thereby allowing the second housing 201 to slide more easily relative to the first housing 200.

Figure 3:
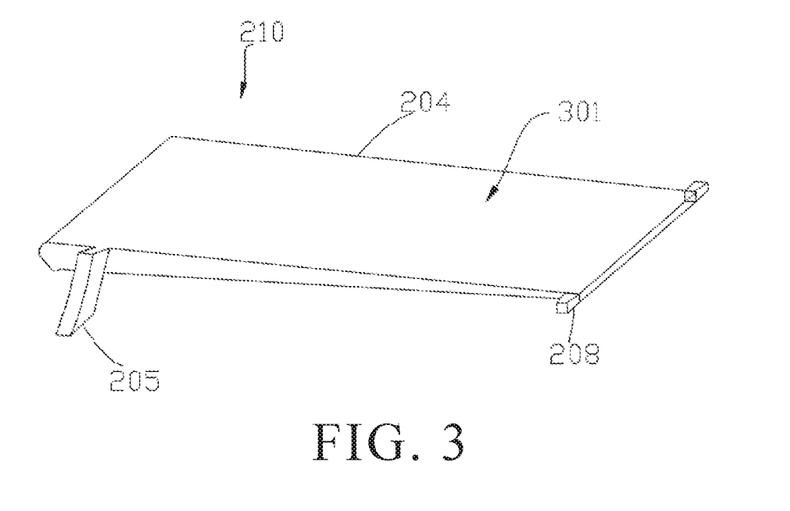
FIG. 3 is a schematic structural diagram of an enlarged structure of a support plate mechanism in FIG. 2.

Specifically, as shown in FIG. 3, FIG. 3 is a schematic structural diagram of an enlarged structure of the support plate mechanism in FIG. 2. The support plate mechanism 210 includes the support plate 204, the first locating parts 205, and the second locating parts 208. When disposing, the first locating parts 205 and the second locating parts 208 are all disposed on sides of the support plate 204 and protrude outward relative to the sides of the support plate 204. By this way, connections to the corresponding slideways and sliding relative to the corresponding slideways can be achieved.

Wherein, the support plate 204 includes a second support surface 301, and a thickness of the support plate 204 is gradually reduced along a direction from the first locating parts 205 to the second locating parts 208. In this way, when the support plate 204 is used for supporting, due to a lesser thickness and a lesser weight of a distal end, support can be more stable.

Meanwhile, during expansion of the flexible display panel, the support plate 204 rotates relative to the rolling mechanism and the second accommodating cavity. When the first locating parts 205 are the arc sliding blocks, during the expansion, the first locating grooves matching with the arc sliding blocks are also arc sliding grooves, and the arc sliding grooves and the arc sliding blocks have a first rotation axis and rotate around the first rotation axis. During rotation, the first rotation axis and the first support surface of the second housing are on a same plane, and in this way, when completely expanded, the second support surface 301 of the support plate 204 and the first support surface of the first support structure in the second housing are on a same plane to support the flexible display panel.

The second support surface 301 of the support plate 204 in the embodiment of the present disclosure can support the flexible display screen expanded thereon and maintain stability of the flexible display screen to improve display effect. The second support surface 301 supports with its whole surface, so it can fit perfectly with the flexible display screen, and a support effect of the support plate 204 is better. A structure of the support plate 204 in FIG. 3 is only an example, and other support members that realize this function are same as the support plate in this embodiment of the present disclosure.

Figure 4:
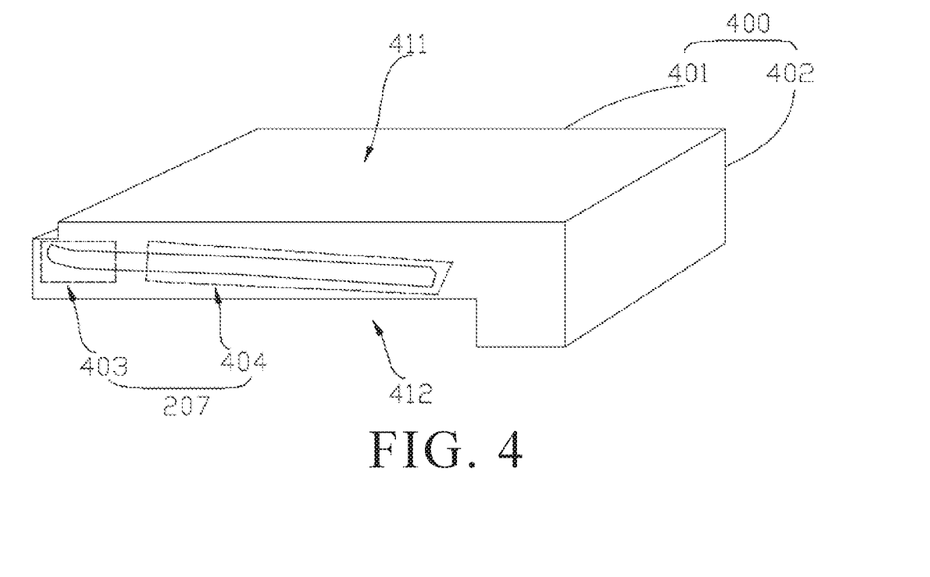
FIG. 4 is a schematic structural diagram of a second housing according to an embodiment of the present disclosure.

Further, as shown in FIG. 4, FIG. 4 is a schematic structural diagram of a second housing according to an embodiment of the present disclosure. An upper surface of the second housing 400 can be a flat surface as a whole, that is, a first support surface 411, and the first support surface 411 effectively supports the flexible screen disposed thereon. The second housing 400 includes a first support structure 401 and an operation structure 402. The second locating grooves 207 are disposed on two opposite sides of the second housing 400. There is a tilt angle between the second locating grooves 207 and the first support surface 411. Correspondingly, when the support plate 204 matches with the second accommodating cavity 412, a distance between the first support surface 411 and the second accommodating cavity 412 is gradually increased in a direction of the second accommodating cavity 412 away from the support plate, that is, the second accommodating cavity 412 can be disposed tilted. In the embodiment of the present disclosure, the second locating grooves 207 may be disposed as linear slideways 404 and curved slideways 403, and a slideway surface of the curved slideways 403 is curved.

In the embodiment of the present disclosure, a projection length of the curved slideways 403 on a direction of the flexible display screen is less than a projection length of the linear slideways 404 on the direction of the flexible display screen. The two types of slideways constitute the second locating grooves 207 in the embodiment of the present disclosure. Wherein, the linear slideways 404 corresponding to the second accommodating cavity 412 may be disposed tilted, and centers of curvature of the curved slideways 403 face toward the upper surface of the second housing 400. Locating parts corresponding to the second locating grooves 207 may slide in the second locating grooves 207.

Preferably, a thickness of the first support structure 401 is less than a thickness of the operation structure 402. After the first housing and the second housing 400 are assembled, at least a part of the first support structure 401 is accommodated in the first housing, so the thickness of the first support structure 401 is less than a thickness of the first housing, and the operation structure 402 can seal an opening of the first housing, thus, the thickness of the operation structure 402 can be same as the thickness of the first housing. Meanwhile, because the second housing 402 can slide relative to the first housing, a length of the second housing 402 is less than a length of the first housing.

Figure 5:
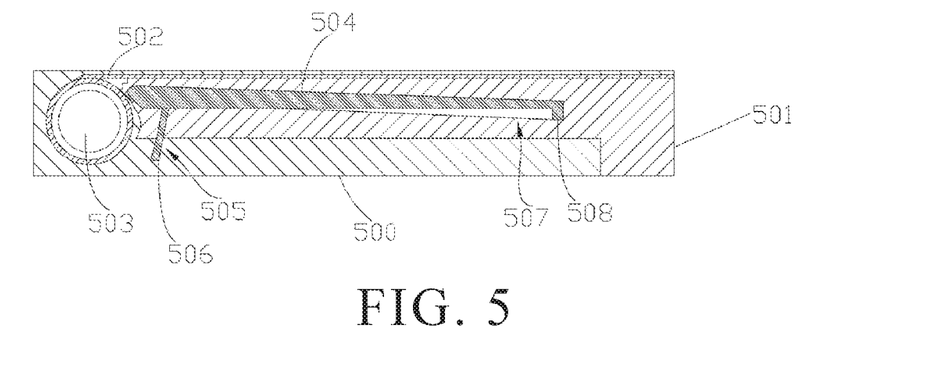
FIG. 5 is a schematic cross-sectional structural diagram of a flexible display device when completely retracted according to an embodiment of the present disclosure.

Specifically, as shown in FIG. 5, FIG. 5 is a schematic cross-sectional structural diagram of a flexible display device when completely retracted according to an embodiment of the present disclosure. The flexible display device includes a first housing 500, a second housing 501, a flexible display screen 502, a rolling mechanism 503, and a support plate 504. Meanwhile, the flexible display device further includes first locating grooves 505 and second locating grooves 507 disposed corresponding to first locating parts 506 and second locating parts 508 disposed on the support plate 504. The support plate 504 is respectively connected to the first housing 500 and the second housing 501 and prevents the second housing 501 from being pulled away from the first housing 500 by the first locating parts 506 and the second locating parts 508.

When the device is completely closed and the flexible display screen is retracted, most of the flexible display screen 502 is rolled up onto the rolling mechanism 503, while a part of the flexible display screen 502 is attached to a surface of the second housing 501, a volume of the flexible display device is smallest at this stage. The support plate 504 is in a tilted state, and two kinds of locating parts at both ends of the support plate 504 are respectively in slideways corresponding to the locating parts.

Figure 6:
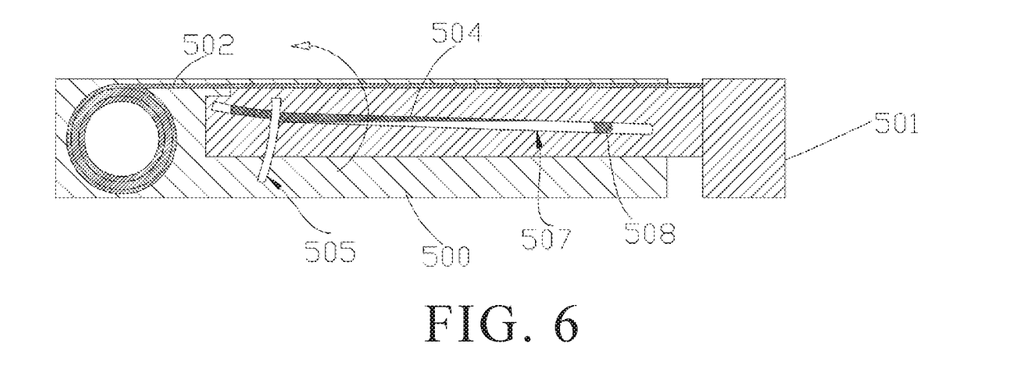
FIG. 6 is a schematic cross-sectional structural diagram of the flexible display device when partially expanded according to an embodiment of the present disclosure.

As shown in FIG. 6, FIG. 6 is a schematic cross-sectional structural diagram of the flexible display device when partially expanded according to an embodiment of the present disclosure. Combining with the flexible display device of FIG. 5 which is in the complete closed state, when the second housing 501 moves relative to the first housing 500 along sliding rails, the flexible display screen 502 is expanded and the flexible display screen 502 rolled up onto the rolling mechanism is released. Meanwhile, during expansion, due to an existence of the support plate 504, the locating parts at the both ends of the support plate 504 are respectively limited by the second locating grooves 507 of the second housing 501 and the first locating grooves 505 of the first housing 500, and curved centers of the first locating grooves 505 are on a same plane as an upper surface of the first housing 500. Therefore, during entire expansion of the flexible display screen 502, the support plate 504 will rotate counterclockwise relative to the first housing 500, slide along the second locating grooves 507, and rotate relative to the second accommodating cavity. During rotation, a support plate 504 rotating axis and the first support surface of the second housing 501 are on a same plane, the corresponding first support surface of a part of the second housing 501 drawn out supports the flexible display screen.

Figure 7:
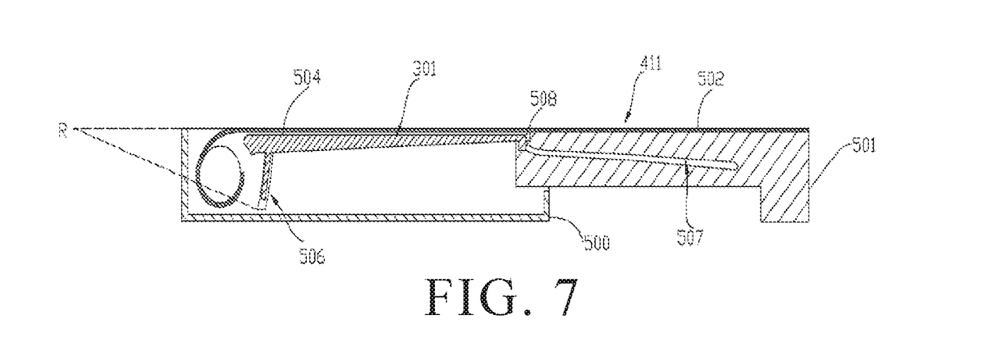
FIG. 7 is a schematic cross-sectional structural diagram of the flexible display device when completely expanded according to an embodiment of the present disclosure.

As shown in FIG. 7, FIG. 7 is a schematic cross-sectional structural diagram of the flexible display device when completely expanded according to an embodiment of the present disclosure. Combing with the schematic cross-sectional structural diagrams of FIGS. 5 and 6, when the flexible display screen 502 is completely expanded, the flexible display screen 502 rolled up onto the rolling mechanism is fully released. At this stage, the second locating parts 508 of the support plate 504 slide to a left end part of the second locating grooves 507, and the second locating parts 508 are limited into the second locating grooves 507 and unable to be pulled out, thereby preventing the second housing 501 from being completely pulled out from the first housing 500.

Meanwhile, after completely expanded, arc centers R of the first locating grooves 506, that is, the first rotation axis of the embodiment of the present disclosure, and the first support surface 411 are on the same plane. Since the support plate 504 rotates with the first rotation axis and is limited by the second locating grooves 507, the support plate 504 changes from an initial tilted state to a final horizontal state. At this stage, the first support surface 411 on the second housing 501 and the second support surface 301 on the support plate 504 are on a same plane, and the flexible display screen covers the first support surface 411 and the second support surface 301. At this stage, the first support surface 411 and the second support surface 301 support the flexible display screen 502 with their whole surfaces. The support effect is good, and there will be no collapse when the flexible display screen 502 is touched.

Specifically, the upper surface of the support plate 504, that is, whole surface of the second support surface 301, has whole surface supporting and fixing effects on the flexible display screen 502 in its corresponding area.

Further, the second housing 501 on a right side of the flexible display device is drawn out, so the first support surface 411 of the second housing 501 attached to the flexible screen also has whole surface supporting and fixing effects on the flexible display screen 502 in its corresponding area. When an operation, such as touching, is performed on the flexible display screen 502, since any support area is surface support, the flexible display screen 502 can be fully attached to support surfaces, and there is no problem of collapse caused by touching, thereby ensuring normal operations of the flexible display device.

The flexible display device provided by the present disclosure is described in detail above. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A flexible display device, comprising:
   a first housing comprising a first accommodating cavity defined in the first housing;
   a second housing disposed slidably relative to the first housing along a first direction, wherein the second housing comprises a first support structure with one end mounted into the first accommodating cavity and an operation structure connected to another end at the first support structure, and the first support structure comprises a first support surface defined on a surface of the first support structure and a second accommodating cavity defined in the first support structure;
   a support plate mechanism, wherein one end of the support plate mechanism is disposed rotatably in the first accommodating cavity, another end of the support plate mechanism comprises a support plate mounted in the second accommodating cavity, and a second support surface is defined on a surface of the support plate;
   a rolling mechanism disposed rotatably in the first accommodating cavity of the first housing; and
   a flexible display panel, wherein one end of the flexible display panel is connected to the rolling mechanism and rolled up in the first accommodating cavity by the rolling mechanism, and another end of the flexible display panel covers the first support surface and is connected to the operation structure;
   wherein when the second housing slides relative to the first housing to expand, the flexible display panel further covers the second support surface of the support plate;
   a distance between the second accommodating cavity and the first support surface increases along a direction away from the support plate, and a thickness of the operation structure is same as a thickness of the first housing;
   wherein the support plate mechanism further comprises a pair of first locating parts disposed at one end of the support plate, and a pair of first locating grooves are defined in the first accommodating cavity of the first housing corresponding to the first locating parts; and
   wherein each of the first locating parts comprises an arc shaped siding block, and each of the first locating grooves are corresponding arc shaped sliding grooves.

2. The flexible display device according to claim 1, wherein the first locating parts are disposed on both sides of the one end of the support plate, and inner walls on both sides of the first accommodating cavity are correspondingly provided with the first locating grooves.

3. The flexible display device according to claim 1, wherein the arc sliding block rotates around a first rotation axis, and the first rotation axis and the first support surface are on a same plane.

4. The flexible display device according to clan 1, wherein the support plate mechanism further comprises second locating parts disposed at another end of the support plate, and inner walls of the second accommodating cavity of the second housing are provided with channels of second locating grooves for the second locating parts to extend into the second accommodating cavity.

5. The flexible display device according to claim 4, wherein the first locating parts are disposed on both sides of the one end of the support plate, inner walls on both sides of the first accommodating cavity are correspondingly provided with the first locating grooves, and both sides of the another end of the support plate are provided with the second locating parts.

6. The flexible display device according to claim 1, wherein when the flexible display panel is completely expanded, the first support surface and the second support surface are on a same plane, and the flexible display panel covers the first support surface and the second support surface.

7. A flexible display device, comprising:
a first housing comprising a first accommodating cavity defined in the first housing;
a second housing disposed slidably relative to the first housing along a first direction, wherein the second housing comprises a first support structure with one end mounted into the first accommodating cavity and an operation structure connected to another end of the first support structure, and the first support structure comprises a first support surface defined on a surface of the first support structure and a second accommodating cavity defined in the first support structure;
a support plate mechanism, wherein one end of the support plate mechanism is disposed rotatably in the first accommodating cavity, another end of the support plate mechanism comprises a support plate mounted in the second accommodating cavity, and a second support surface is defined on a surface of the support plate;
a rolling mechanism disposed rotatably in the first accommodating cavity of the first housing; and
a flexible display panel, wherein one end of the flexible display panel is connected to the rolling mechanism and rolled up in the first accommodating cavity by the rolling mechanism, and another end of the flexible display panel covers the first support surface and is connected to the operation structure;
wherein when the second housing slides relative to the first housing to expand, the flexible display panel further covers the second support surface of the support plate;
wherein the support plate mechanism further comprises a pair of first locating parts disposed at one end of the support plate, and a pair of first locating grooves are defined in the first accommodating cavity of the first housing corresponding to the first locating parts; and
wherein each of the first locating parts comprises an arc shaped sliding block, and each of the first locating grooves are corresponding arc shaped sliding grooves.

8. The flexible display device according to claim 7, wherein the first locating parts are disposed on both sides of the one end of the support plate, and inner walls on both sides of the first accommodating cavity are correspondingly provided with the first locating grooves.

9. The flexible display device according to claim 7, wherein the arc sliding block rotates around a first rotation axis, and the first rotation axis and the first support surface are on a same plane.

10. The flexible display device according to claim 7, wherein the support plate mechanism further comprises second locating parts disposed at another end of the support plate, and inner walls of the second accommodating cavity of the second housing are provided with channels of second locating grooves for the second locating parts to extend into the second accommodating cavity.

11. The flexible display device according to claim 10, wherein the first locating parts are disposed on both sides of the one end of the support plate, inner walls on both sides of the first accommodating cavity are correspondingly provided with the first locating grooves, and both sides of the another end of the support plate are provided with the second locating parts.

12. The flexible display device according to claim 7, wherein a distance between the second accommodating cavity and the first support surface increases along a direction away from the support plate.

13. The flexible display device according to claim 12, wherein the second accommodating cavity comprises a curved portion disposed adjacent to the first support surface.

14. The flexible display device according to claim 7, wherein when the flexible display panel is completely expanded, the first support surface and the second support surface are on a same plane, and the flexible display panel covers the first support surface and the second support surface.

15. The flexible display device according to claim 7, wherein the first support surface and the second support surface support with their whole surfaces.

16. The flexible display device according to claim 7, wherein a thickness of the operation structure is same as a thickness of the first housing.

* * * * *